(12) United States Patent
Lu et al.

(10) Patent No.: US 8,505,732 B2
(45) Date of Patent: Aug. 13, 2013

(54) WAFER CONTAINER WITH ELASTICITY MODULE

(75) Inventors: Shao-Wei Lu, Taipei County (TW); Pao-Yi Lu, Tucheng (TW); Chien-Feng Wang, Tucheng (TW)

(73) Assignee: Gudeng Precision Industrial Co, Ltd., Taipei County (TW)

( * ) Notice: Subject to any disclaimer, the term of this patent is extended or adjusted under 35 U.S.C. 154(b) by 140 days.

(21) Appl. No.: 12/893,155

(22) Filed: Sep. 29, 2010

(65) Prior Publication Data
US 2011/0297579 A1    Dec. 8, 2011

(30) Foreign Application Priority Data
Jun. 2, 2010  (TW) .............................. 99117708 A

(51) Int. Cl.
*B65D 85/00* (2006.01)
(52) U.S. Cl.
USPC ............................ 206/711; 206/710; 206/454
(58) Field of Classification Search
USPC .............. 206/454, 586, 710, 711; 211/41.18; 414/217.1, 940, 936
See application file for complete search history.

(56) References Cited

U.S. PATENT DOCUMENTS

| | | | |
|---|---|---|---|
| 4,043,451 A * | 8/1977 | Johnson | ........................ 206/711 |
| 4,248,346 A | 2/1981 | Johnson | |
| 4,555,024 A | 11/1985 | Voss et al. | |
| 5,253,755 A | 10/1993 | Maenke | |
| 5,273,159 A | 12/1993 | Gregerson | |
| 5,452,795 A * | 9/1995 | Gallagher et al. | ............. 206/711 |
| 5,555,981 A * | 9/1996 | Gregerson | ..................... 206/711 |
| 5,586,658 A | 12/1996 | Nyseth | |
| 5,816,410 A * | 10/1998 | Nyseth | .......................... 206/711 |
| 6,098,809 A * | 8/2000 | Okada et al. | ................... 206/711 |
| 6,267,245 B1 * | 7/2001 | Bores et al. | ..................... 206/711 |
| 6,776,289 B1 * | 8/2004 | Nyseth | .......................... 206/711 |
| 6,951,284 B2 * | 10/2005 | Cheesman et al. | ............. 206/711 |
| 7,357,258 B2 * | 4/2008 | Matsutori et al. | ............. 206/711 |
| 7,726,490 B2 * | 6/2010 | Matsutori et al. | ............. 206/711 |
| 2010/0025288 A1 * | 2/2010 | Lin et al. | ......................... 206/711 |
| 2010/0108565 A1 * | 5/2010 | Lu et al. | .......................... 206/711 |
| 2010/0258475 A1 * | 10/2010 | Ogawa | ........................... 206/711 |
| 2010/0282638 A1 * | 11/2010 | Chiu et al. | ..................... 206/710 |
| 2010/0307957 A1 * | 12/2010 | Wiseman | ........................ 206/711 |
| 2011/0114534 A1 * | 5/2011 | Watson et al. | ................. 206/710 |

* cited by examiner

*Primary Examiner* — David Fidei
(74) *Attorney, Agent, or Firm* — Ming Chow; Sinorica, LLC

(57) ABSTRACT

A wafer container, comprising: a container body, the container body having a plurality of slot portions on two opposite sidewalls of the interior of the container body for horizontally sustaining a plurality of wafers, each slot portion having a horizontal carrying portion, an opening being formed on one side of the container body for exporting and importing a plurality of wafers; and a door, said door having an inner surface and a outer surface, the inner surface being joined with the opening of the container body for protecting the plurality of wafers therein, the characteristic in that: an elasticity module is disposed on the inner wall of the rear end of the container body opposite to the opening, the elasticity module having a rectangular body and a convex portion bending toward the interior of the container body being respectively formed on two longer opposite sides of the rectangular body.

16 Claims, 23 Drawing Sheets

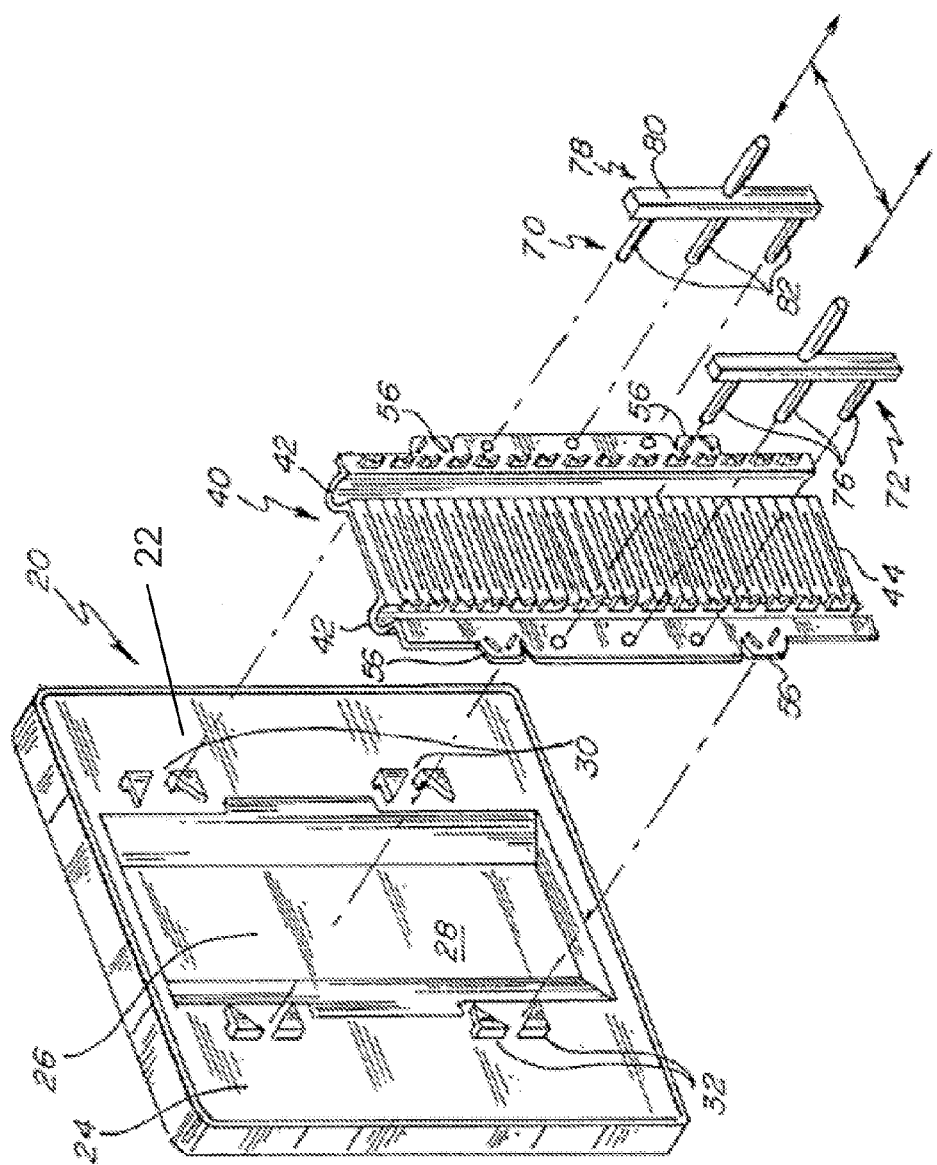

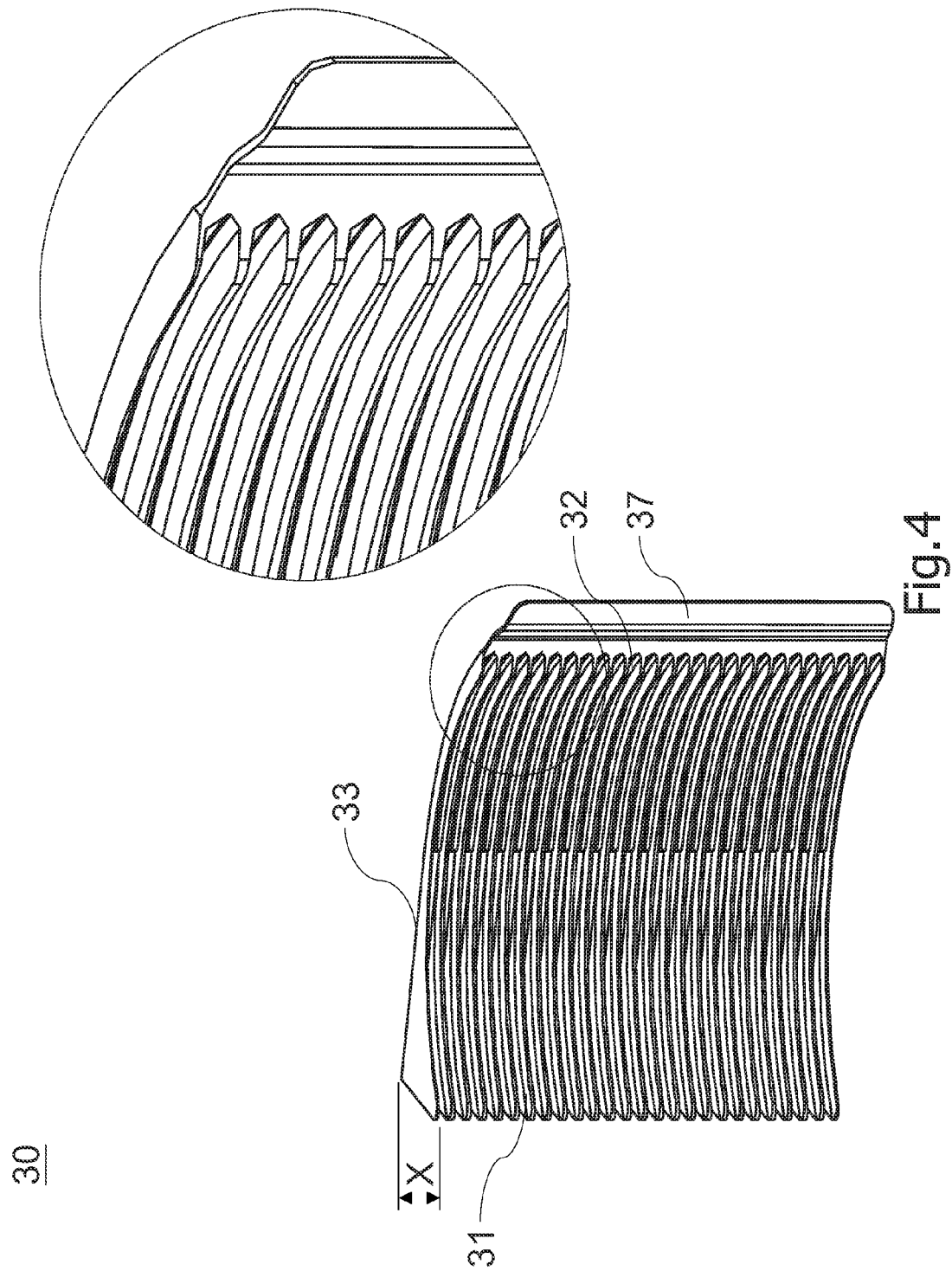

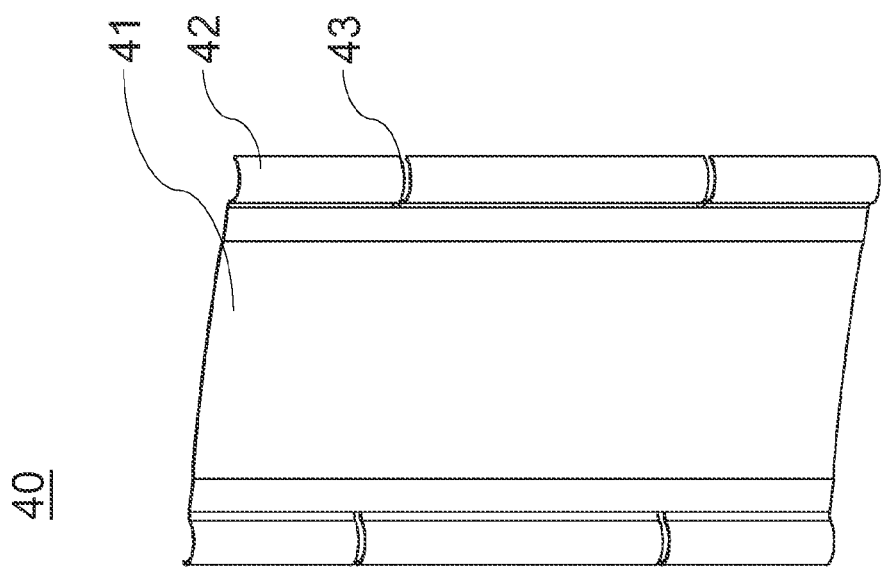

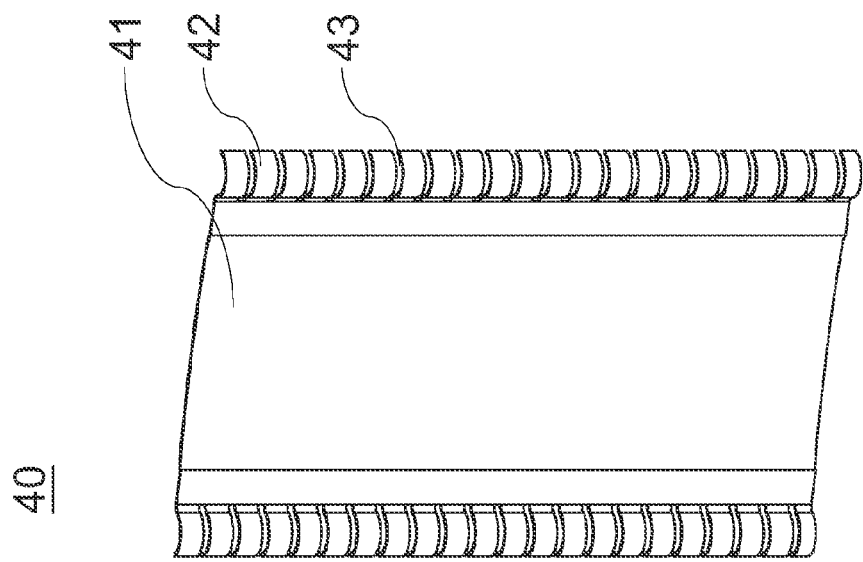

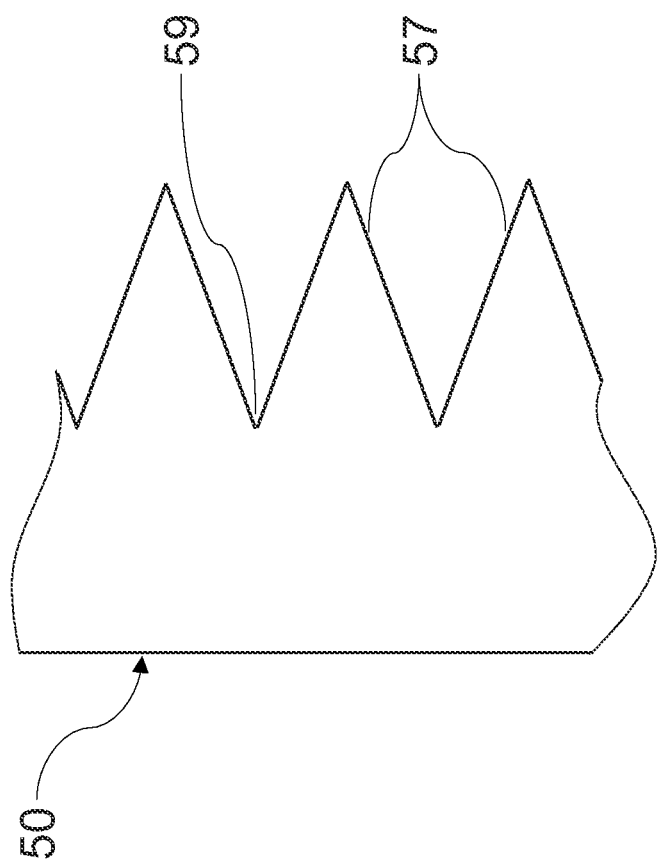

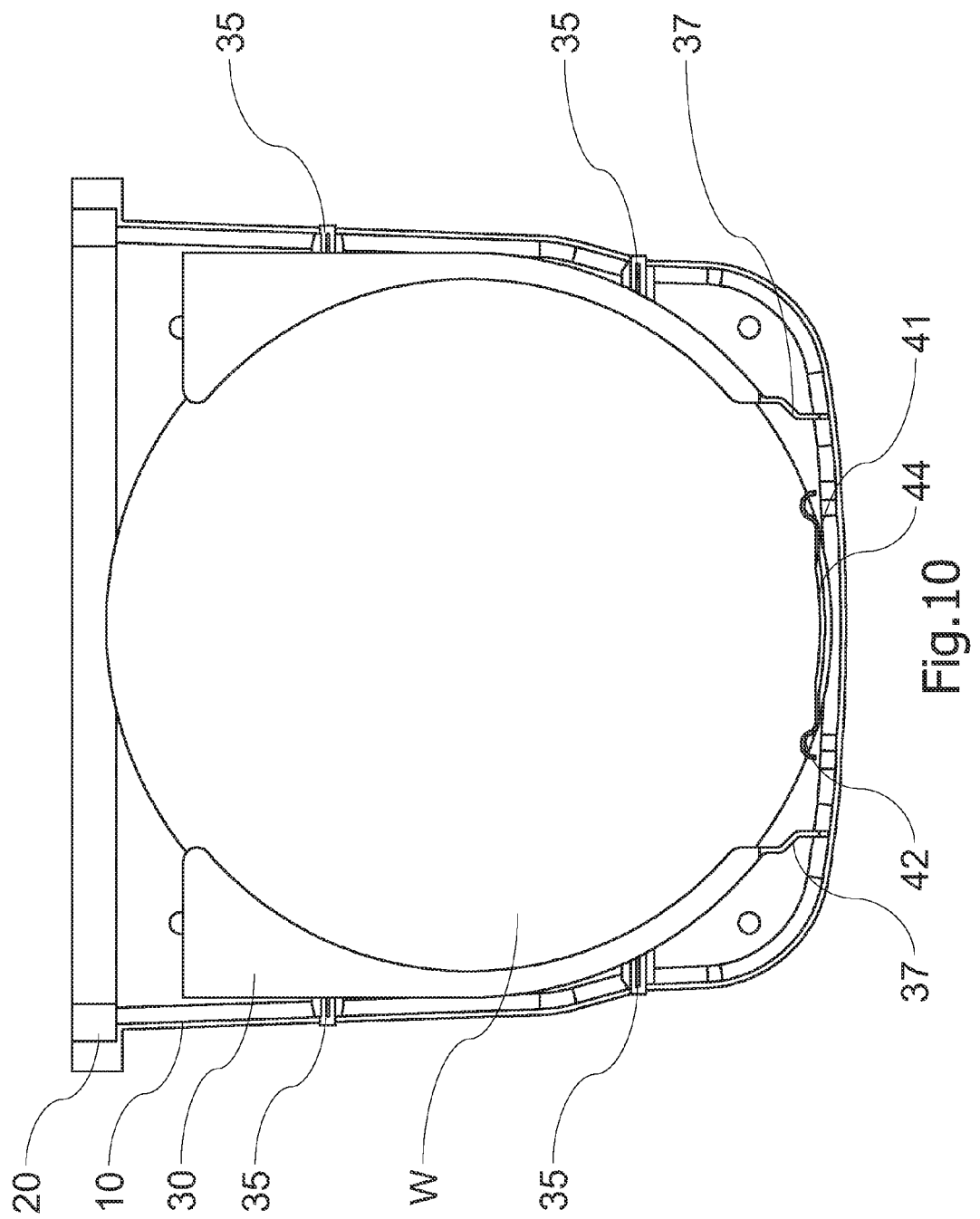

WAFER CONTAINER WITH ELASTICITY MODULE

BACKGROUND OF THE INVENTION

1. Field of the Invention

The present invention is related to a wafer container, and more particularly, to a wafer container with its interior being disposed with an elasticity module that provides elastic buffering mechanism to protect the wafers from being damaged due to excessive vibration in the transferring process.

2. Description of the Prior Art

The semiconductor wafers need to be transferred to different work stations to go through various processes in required equipments. In order to facilitate the transferring of wafers and to prevent the pollution of wafers from occurring during transferring process, a sealed container is provided for the automatic transferring process. Referring to FIG. 1, which is a view of wafer container of the prior art. The wafer container includes a container body 10 and a door 20. The container body 10 is disposed with a plurality of slots 11 for horizontally supporting a plurality of wafers (not shown in Figure), and an opening 12 is located on a sidewall of the container body 10 for exporting and importing the wafers. The door 20 further includes an outer surface 21 and an inner surface 22, wherein the door 20 is joined with the opening 12 of the container body 10 via the inner surface 22 to protect the plurality of wafers within the container body 10. Furthermore, at least one latch hole 23 is disposed on the outer surface 21 of the door 20 for opening or closing the wafer container. In the wafer container described above, the wafers are horizontally placed in the container body 10, and thus, a wafer restraint component is needed in the wafer container to prevent wafers from displacing or moving toward the opening 12 of container body 10 during the wafer transferring process due to vibration.

Referring to FIG. 2A, which is a view of the door of a wafer container disclosed in U.S. Pat. No. 6,267,245. As shown in FIG. 2B, the inner surface 22 of the door 20 is disposed with a recess 28, in which wafer restraint modules 40 are further disposed. The wafer restraint modules 40 are composed of a plurality of elasticity portions 40, and two rows of wafer contact portions 52/54 are oppositely disposed on two sides of each wafer restraint module 40, as shown in FIG. 2C; the two rows of wafer contact portions 52/54 are alternatively arranged, and bevel structures 53/55 are formed on each of the wafer contact portions 52/54. Moreover, referring to FIG. 2A, wafer contact portions 120 are disposed on the inner wall of the rear end of the container body 10 opposite to the opening, and referring also to FIG. 2D, two rows of bevel structures 131/133 are formed on each of the wafer contact portions 120. Apparently, the bevel structures 53/55 formed on the wafer contact portions 52/54 and the bevel structures 131/133 formed on the wafer contact portions 120 are alternatively arranged. Therefore, when the door 20 closes the container body 10, the plurality of wafers in the container body 10 will be fixed in bevel structures 53/55 and bevel structures 131/133. Thus, by fastening the wafers with the design of wafer contact portions 52/54 and wafer contact portions 120, the wafers can be prevented from displacing or moving toward the opening of container body during the wafer transferring process due to vibration.

Apparently, the structure of wafer contact portions used in the prior art for fastening the wafers is of higher hardness, and therefore the wafers may crack if there is excessive vibration during the wafer transferring process; more particularly, if the wafers placed in the wafer container are 12" wafers or 18" wafers, the problem of wafer cracking caused by vibration will be even more serious.

SUMMARY OF THE INVENTION

In the wafer container of the prior art, wafers can be stably placed in the wafer container with the support of wafer contact portions; however, vibration occurring in the wafer transferring process may still cause displacement of wafer or movement of wafer toward the opening which may thus lead to damages. In addition, when the door and the container body are disjoined, wafers may still be fastened to wafer contact portions. To solve the aforementioned problem, one primary objective of the present invention is to provide a wafer container disposed with elasticity module which cooperates with the restraint module on the door for sustaining the wafers and serves as a buffer in order to prevent the wafers from displacing or moving toward the opening of the container body due to vibration occurring in the wafer transferring process.

Another primary objective of the present invention is to provide a wafer container disposed with elasticity module, in which, with the cooperation of restraint module and slant portions of the slot portions, wafers can be raised along with the upwardly extending slant portions when the door and the opening of the container body are joined, wherein the wafers can be suspendingly placed in the container body so that movement of wafers during the transferring process that may cause damage can be prevented.

Still another primary objective of the present invention is to provide a wafer container disposed with elasticity module, in which, with the cooperation of restraint module and slant portions of the slot portions, wafers are pushed toward the opening of the container body by the counterforce generated by the elasticity module when the door and the opening of the container body are disjoined and then slide downward along the slant portions and return to the original position so that the possibility of wafer slipping is eliminated.

Yet another primary objective of the present invention is to provide a wafer container disposed with elasticity module, the convex portions of which are disposed with a plurality of notches vertically arranged at intervals, wherein when the door and the opening of the container body are disjoined, counterforce is evenly provided to each of the wafers by the elasticity module for the displacement measure of each wafer pushed toward the opening of the container body to be the same.

And still another primary objective of the present invention is to provide a wafer container disposed with elasticity module, the inner surface of the door of which being disposed with restraint module and the inner wall of the rear end of the container body opposite to the opening of which being disposed with elasticity module for effectively fastening the wafers.

In order to achieve the aforementioned objectives, the present invention discloses a wafer container, which comprises a container body and a door. A plurality of slot portions are disposed on two opposite sidewalls of the interior of the container body for horizontally sustaining a plurality of wafers, and each slot portion has a horizontal carrying portion. An opening is formed on one sidewall of the container body for exporting and importing the plurality of wafers. The door includes an outer surface and an inner surface and is joined with the opening of container body via its inner surface for protecting the plurality of wafers in the container body. The characteristic of the wafer container is in that: an elasticity module is disposed on the inner wall of the rear end of the container body opposite to the opening, the elasticity module having a rectangular body and a convex portion bending toward the interior of the container body being respectively formed on two longer opposite sides of the rectangular body. Moreover, an upwardly extending slant portion is formed on the end of the carrying portion of each of the slot portions near the elasticity module. When the door and the opening of the container body are joined, the wafers are raised along with the upwardly extending slant portions.

The present invention then discloses a wafer container, which comprises a container body and a door. A plurality of slot portions are disposed on two opposite sidewalls of the interior of the container body for horizontally sustaining a plurality of wafers, and each slot portion has a horizontal carrying portion. An opening is formed on one sidewall of the container body for exporting and importing the plurality of wafers. The door includes an outer surface and an inner surface and is joined with the opening of container body via its inner surface for protecting the plurality of wafers in the container body. The characteristic of the wafer container is in that: an elasticity module is disposed on the inner wall of the rear end of the container body opposite to the opening, the elasticity module having a rectangular body and a convex portion bending toward the interior of the container body being respectively formed on two longer opposite sides of the rectangular body, the convex portions having a plurality of notches vertically arranged at intervals. Moreover, an upwardly extending slant portion is formed on the end of the carrying portion of each of the slot portions near the elasticity module. When the door and the opening of the container body are joined, the wafers are raised along with the upwardly extending slant portions.

BRIEF DESCRIPTION OF THE DRAWINGS

FIG. 2A to FIG. 2D are views of the door of the wafer container of the prior art;

FIG. 4 is a view of slot portions of the present invention;

FIG. 5A to FIG. 5C are views of elasticity module of the present invention;

FIG. 7B is a side view of restraint module of the present invention;

FIG. 10 is a view of the wafer container of the present invention when the door and the container body are joined.

DESCRIPTION OF THE PREFERRED EMBODIMENT

As the structure of wafer containers used in the present invention is the same as that of the aforementioned wafer container, the details of manufacturing or processes are therefore omitted in the following description. And the drawings referred to in the following are not made according to actual sizes, since the function of the drawings are only to illustrate the characteristics of the present invention. In addition, the technical contents and objectives of and the effects achieved by the present invention are all completely and detailedly disclosed in the following description accompanied by drawings and signs.

Figure 1:
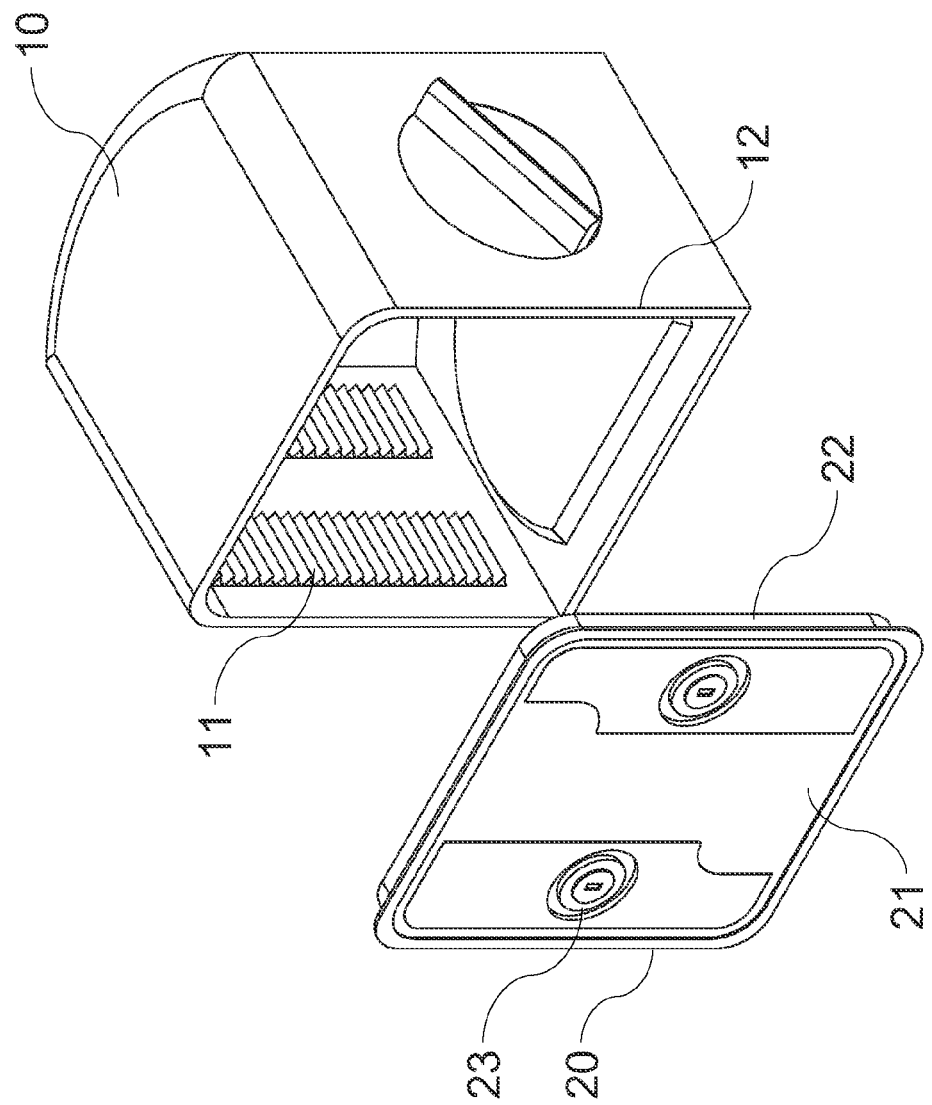
FIG. 1 is a view of a wafer container of the prior art.
Figure 2A:
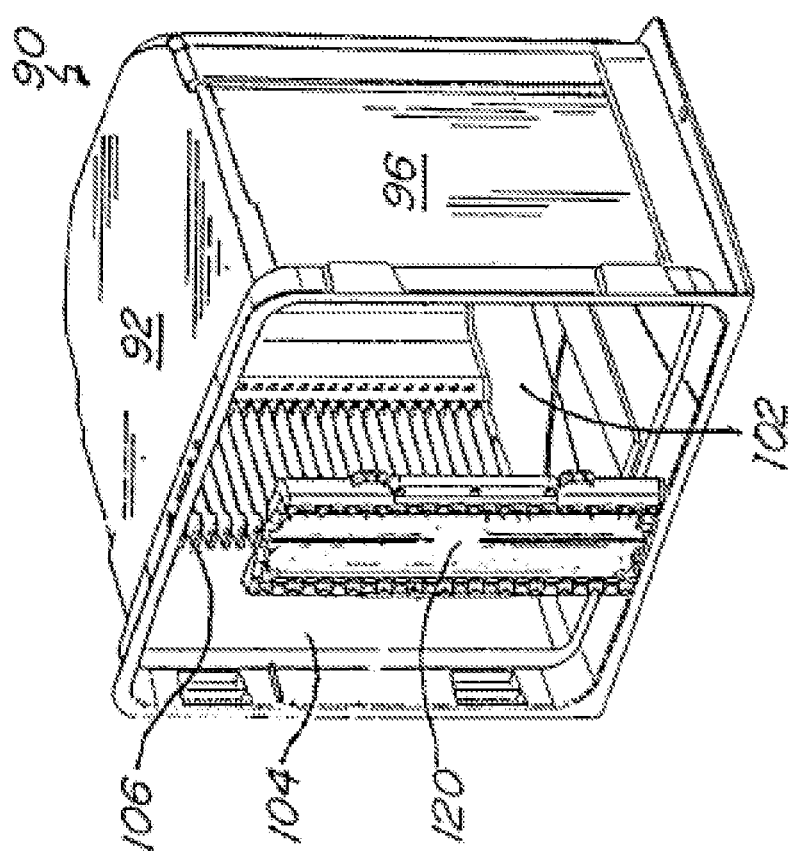
Figure 2C:
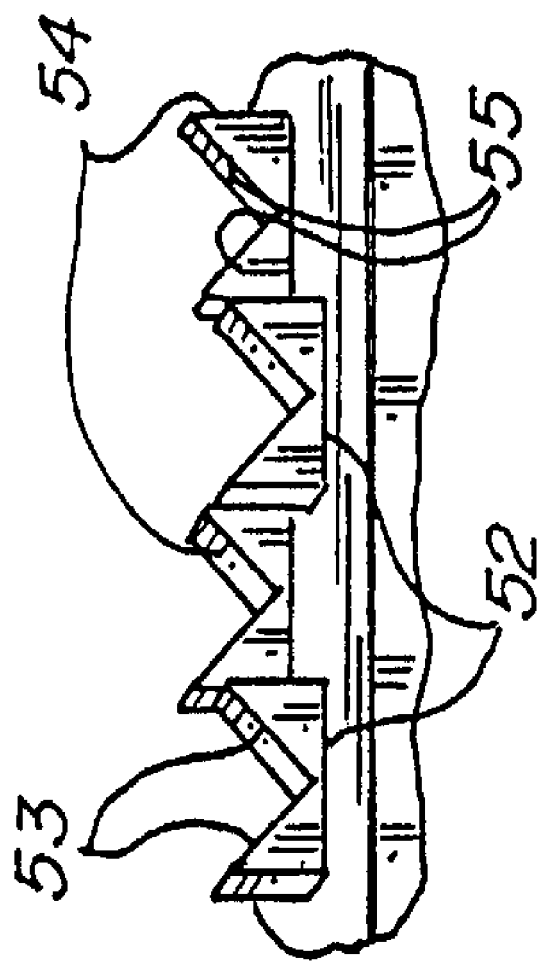
Figure 2D:
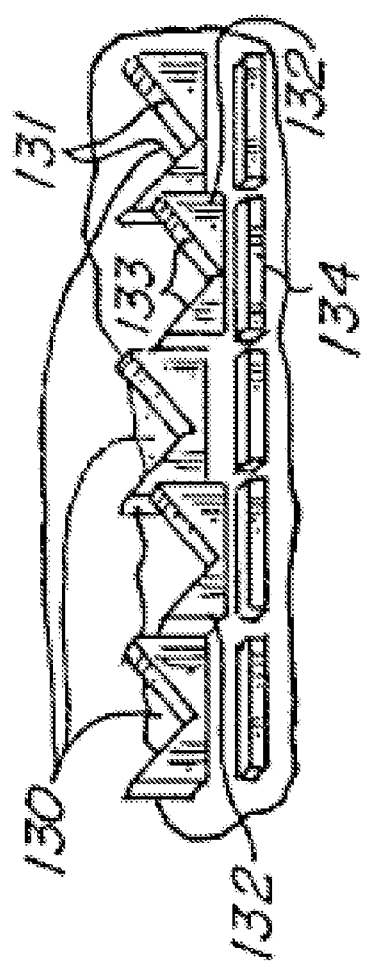
Figure 3:
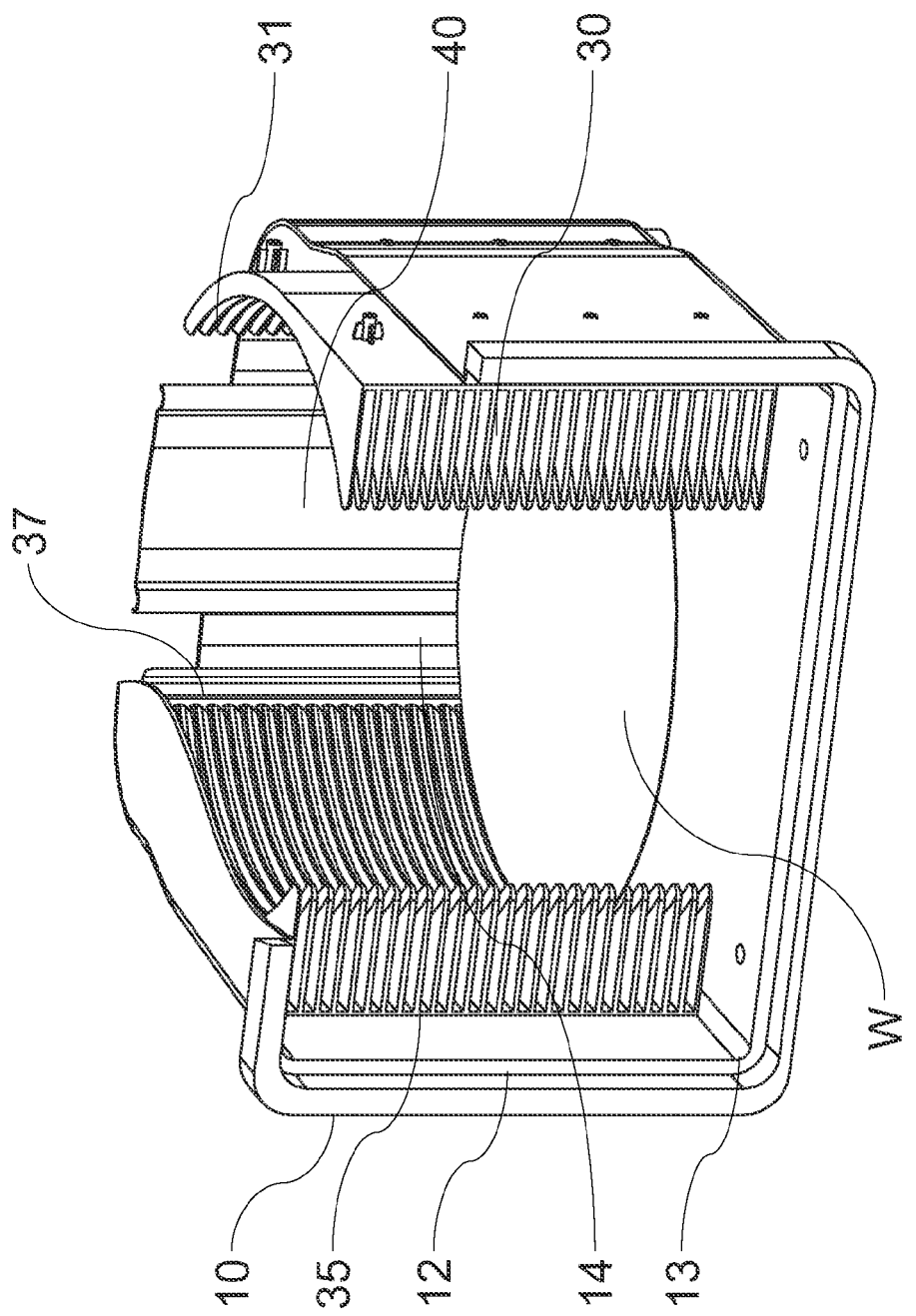
FIG. 3 is a view of a wafer container of the present invention disposed with elasticity module.

Referring first to FIG. 3 for the basic structure of the wafer container, the wafer container has a container body 10 and a door 20 (as shown in FIG. 1). An opening 12 is disposed on one sidewall of the container body 10 for exporting and importing a plurality of wafers W; a pair of slot portions 30 are disposed on two opposite sidewalls 13 of the interior of the container body 10, each slot portion 30 being integrately formed. Referring then to FIG. 4, a plurality of horizontal carrying portions 31 arranged lengthwise are formed on the side of the slot portions 30 facing the interior of the container body 10. To reduce contact area between wafers W and slot portions 30, the structure of horizontal carrying portions 31 is designed as thus: the width X of the structure of horizontal carrying portions 31 near the opening 12 of the container body 10 is larger, and the width of the horizontal carrying portion 31 is gradually reduced as it extends in the direction away from the opening. Moreover, referring still to FIG. 4, each horizontal carrying portion 31 on the pair of slot portions 30 is disposed as horizontally aligned, as shown in FIG. 4. Therefore, each of the opposite horizontal carrying portions 31 in the container body 10 can horizontally sustain and carry each of the wafers W; when wafers W are placed into the container body 10, each of the horizontal carrying portions 30 is used to contact each of the wafers W. Moreover, as shown in FIG. 4, a closed surface 33 is formed on another side of the slot portion 30s for joining together another end of the plurality of horizontal carrying portions 31 facing the interior of the container body 10. In addition, a plurality of fasteners 35 are formed on the closed surface 33, as shown in FIG. 3, and the slot portions 30 can be fastened to the two opposite sidewalls 13 of the interior of the container body 10 by these fasteners 35. What is to be emphasized here is that, the structure of fasteners 35 is not limited in the present invention as long as the fasteners 35 can be snap-fastened to the sidewalls 13 of the interior of the container body 10. Furthermore, a curved structure is formed on the rear end of the slot portions 30, and a fastening piece 37 is formed lengthwise on the end portion of the curve. The fastening piece 37 can be snap-fastened to the inner wall 14 of the rear end of the container body 10 opposite to the opening 12 for fastening the slot portions 30 in the container body 10. Apparently, the slot portions 30 of the present invention can be snap-fastened to the sidewalls 13 via the plurality of fasteners 35 and can be snap-fastened to the inner wall 14 of the container body 10 via the fastening piece 37 of the rear end portion as well.

Then, referring to FIG. 4, an upwardly extending slant portion 32 is formed on one end of each of the slot portions 30 of the present invention at the horizontal carrying portion near the fastening piece 37, and the aforementioned slot portion 30 and slant portion 32 are integratedly formed by injection molding. To sum up, each of the slot portions 30 generally comprises a horizontal portion 31, a slant portion 32, a closed surface 33, and a fastening piece 37. The horizontal portion 31 is on the side of the slot portion 30 facing the interior of the container body 10; the closed surface 33 is formed on another side of the slot portion 30; a curved structure is formed on the rear end of the slot portion 30, and the fastening piece 37 is formed lengthwise on the end portion of the curve; the upwardly extending slant portion 32 is further formed on the end of the horizontal carrying portion 31 near the fastening piece 37; the relative positions of the components are as shown in FIG. 4; the above-mentioned components of slot portion 30 such as horizontal carrying portion 31, slant portion 32, closed surface 33, and fastening piece 37 can be integratedly formed by injection molding.

Then, referring first to FIG. 3, which is a view of the elasticity module of the present invention disposed in the wafer container. Another characteristic of the present invention is the disposition of an elasticity module 40, which is disposed on the inner wall 14 of the rear end of the container body 10 opposite to the opening 12. The elasticity module 40 is formed by a polymer plastic material such as PBT. And the elasticity module 40 can thus be integratedly formed by injection molding.

Figure 5A:
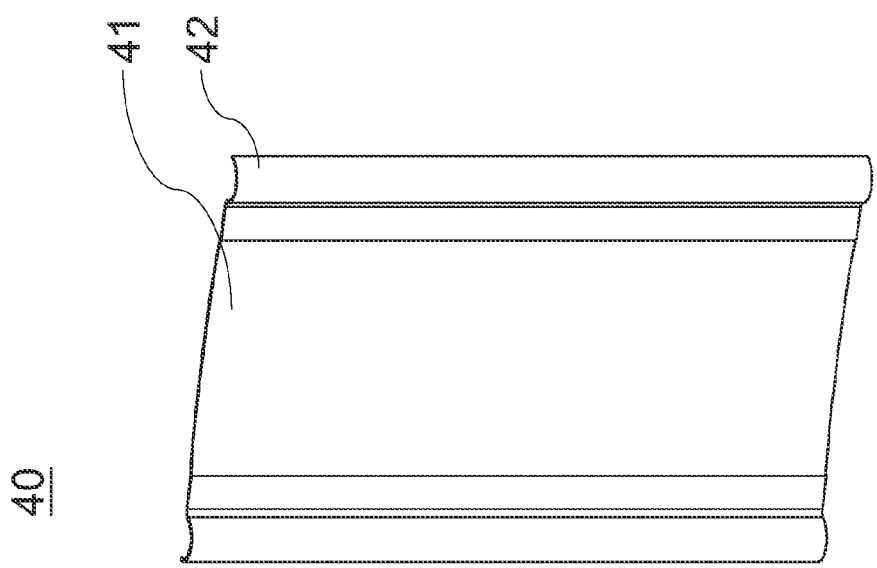
Figure 6A:
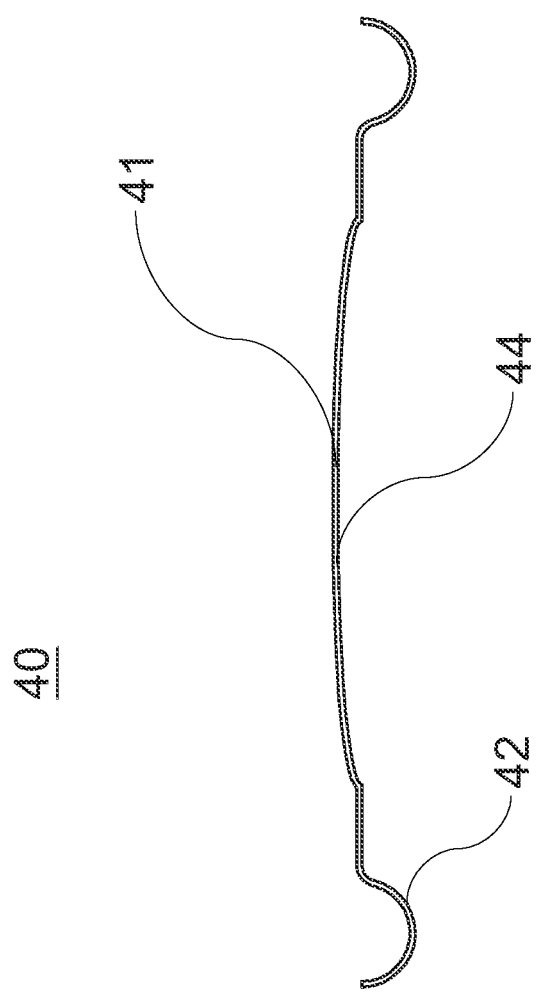
FIG. 6A is a top view of elasticity module of the present invention.

Referring to FIG. 5A, which is a view of the first embodiment of elasticity module of the present invention. The elasticity module 40 has a rectangular body 41, and a convex portion 42 bending toward the interior of the container body 10 and forming a curve is respectively formed on two opposite longer sides of the rectangular body 41, wherein the rectangular body 41 has a curved inwardly recessed portion 44, the top view of the inwardly recessed portion 44 being as shown in FIG. 6A. When the door 20 closes the container body 10, the wafers W are pushed onto the elasticity module 40; meantime, the edges of wafers W are in contact with the convex portion 42 on two sides and extend into the space formed by the inwardly recessed portion 44. Since the elasticity module 40 is elastic, when the edges of wafers W are in contact with the convex portion 42 on two sides, the convex portion 42 will be pressed by wafers W and is slightly deformed; when the door 20 and the container body 10 are disjoined, each of the wafers W can be evenly provided with acting force that originates from the force of the convex portion 42 of elasticity module 40 returning to its original shape and is pushed toward the opening 12 of the container body 10. The objective of disposing elasticity module 40 in the present invention is to ensure that wafers W can move toward the opening 12 of the container body 10 when the door 20 and the container body 10 are disjoined.

Figure 6B:
FIG. 6B to FIG. 6C are side views of elasticity module of the present invention.

Similarly, referring to FIG. 5B, which is a view of the second embodiment of elasticity module of the present invention. The elasticity module 40 is disposed on the inner wall 14 of the rear end of the container body 10 opposite to the opening 12 and its material is the same as that of the elasticity module 40 of the first embodiment. The elasticity module 40 of the present embodiment has a rectangular body 41, and a convex portion 42 bending toward the interior of the container body 10 and forming a curve is respectively formed on two opposite longer sides of the rectangular body 41, wherein a plurality of notches 43 vertically arranged at intervals are disposed on the convex portion 42 for forming a plurality of convex portions 42, a side view of which being as shown in FIG. 6B. Since a wafer container can normally carry 25 wafers W, when the number of notches 43 is two in the present embodiment, the convex portions 42 can be divided into three sections, each section providing an acting force to 8-9 wafers W; in addition, the rectangular body 41 has a curved inwardly recessed portion 44 that can make space for wafers W when they are pushed to the elasticity module 40, a top view of the inwardly recessed portion 44 being as shown in FIG. 6A. When the door 20 closes the container body 10, the wafers W are pushed onto the elasticity module 40, meanwhile, the edges of wafers W are in contact with the convex portions 42 on two sides and extend into the space made by the inwardly recessed portion 44. Since the elasticity module 40 is elastic, thus when the edges of wafers W are in contact with the convex portions 42 on two sides, each of the convex portions 42 will be pressed by wafers W and is slightly deformed; when the door 20 and the container body 10 are disjoined, each of the wafers W can be evenly provided with acting force that originates from the force of the convex portions 42 of elasticity module 40 returning to the original shape and is pushed toward the opening 12 of the container body 10. Apparently, the objective of disposing elasticity module 40 in the present invention is to ensure that wafers W can move toward the opening 12 of the container body 10 when the door 20 and the container body 10 are disjoined.

Figure 6C:
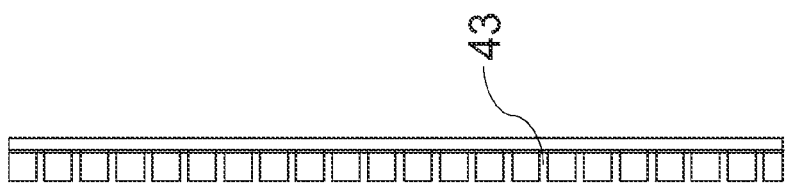

Then, referring to FIG. 5C, which is a view of the third embodiment of elasticity module of the present invention. The elasticity module 40 is disposed on the inner wall 14 of the rear end of the container body 10 opposite to the opening 12 and its material is the same as that of the elasticity module 40 of the embodiment previously described. The elasticity module 40 of the present embodiment has a rectangular body 41, and a convex portion 42 bending toward the interior of the container body 10 and forming a curve is respectively formed on two opposite longer sides of the rectangular body 41, wherein a plurality of notches 43 vertically arranged at intervals are disposed on the convex portion 42, a side view of which being as shown in FIG. 6C. Since a wafer container can normally carry 25 wafers W, when the number of notches 43 is 24 in the present embodiment, the convex portions 42 can be divided into 25 sections. In addition, the rectangular body 41 has a curved inwardly recessed portion 44 that can make space for wafers W when they are pushed to the elasticity module 40, a top view of the inwardly recessed portion 44 being the same as that shown in FIG. 6A. When the door 20 closes the container body 10, the wafers W are pushed onto the elasticity module 40, meanwhile, the edges of each of the wafers W are in contact with the convex portions 42 on two sides and extend into the space made by the inwardly recessed portion 44. When the edges of wafers W are in contact with the convex portions 42 on two sides, each of the convex portions 42 will be pressed by a wafer W and is slightly deformed; when the door 20 and the container body 10 are disjoined, each of the wafers W can be evenly provided with acting force that originates from the force of the convex portions 42 of elasticity module 40 returning to the original shape and is pushed toward the opening 12 of the container body 10.

Figure 7A:
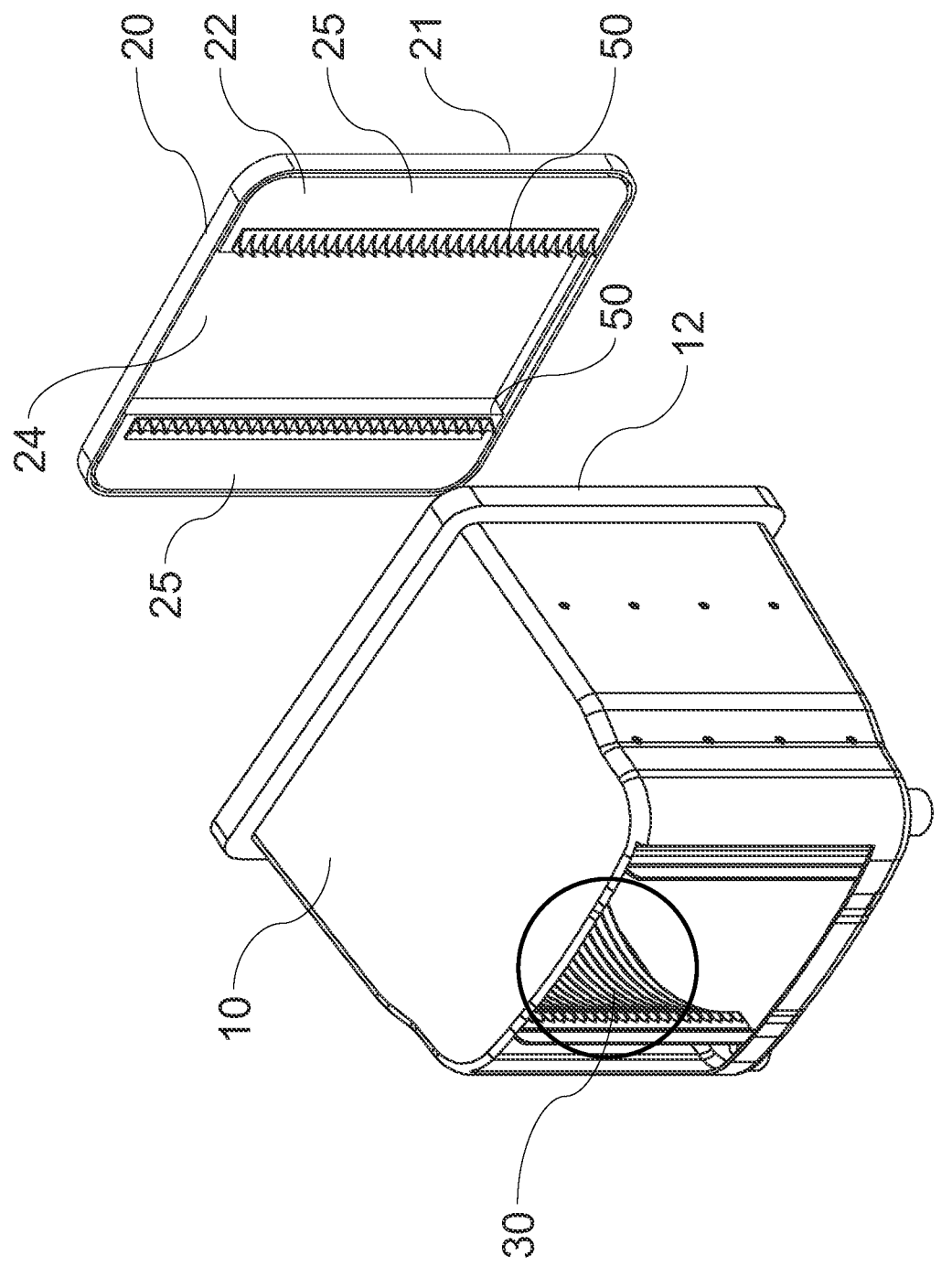
FIG. 7A is a view of wafer container of the present invention with restraint module disposed on the door.

Referring then to FIG. 7A, which is a view of the wafer container of the present invention. The wafer container comprises a container body 10 and a door 20, wherein the container body 10 is the same as that shown in FIG. 3. The door 20 of the present invention has an outer surface 21 and an inner surface 22 and is joined with the opening 12 of the container body 10 via its inner surface for protecting the plurality of wafers W in the container body 10, wherein the inner surface 22 of the door 20 is disposed with a recess 24 which is located between two raised platforms 25. A restraint module 50 is respectively disposed on the edges of each raised platform 25 near the recess 24, and a plurality of bevel structures 57 are further formed on each of the restraint modules 50, a recess portion 59 being further formed on each of the bevel structures 57 near the center. Similarly, the bevel structures 57 formed on the restraint modules 50 and the bevel structures 57 formed on the restraint modules 50 on another side are alternatively disposed, as shown in FIG. 7B.

Figure 8A:
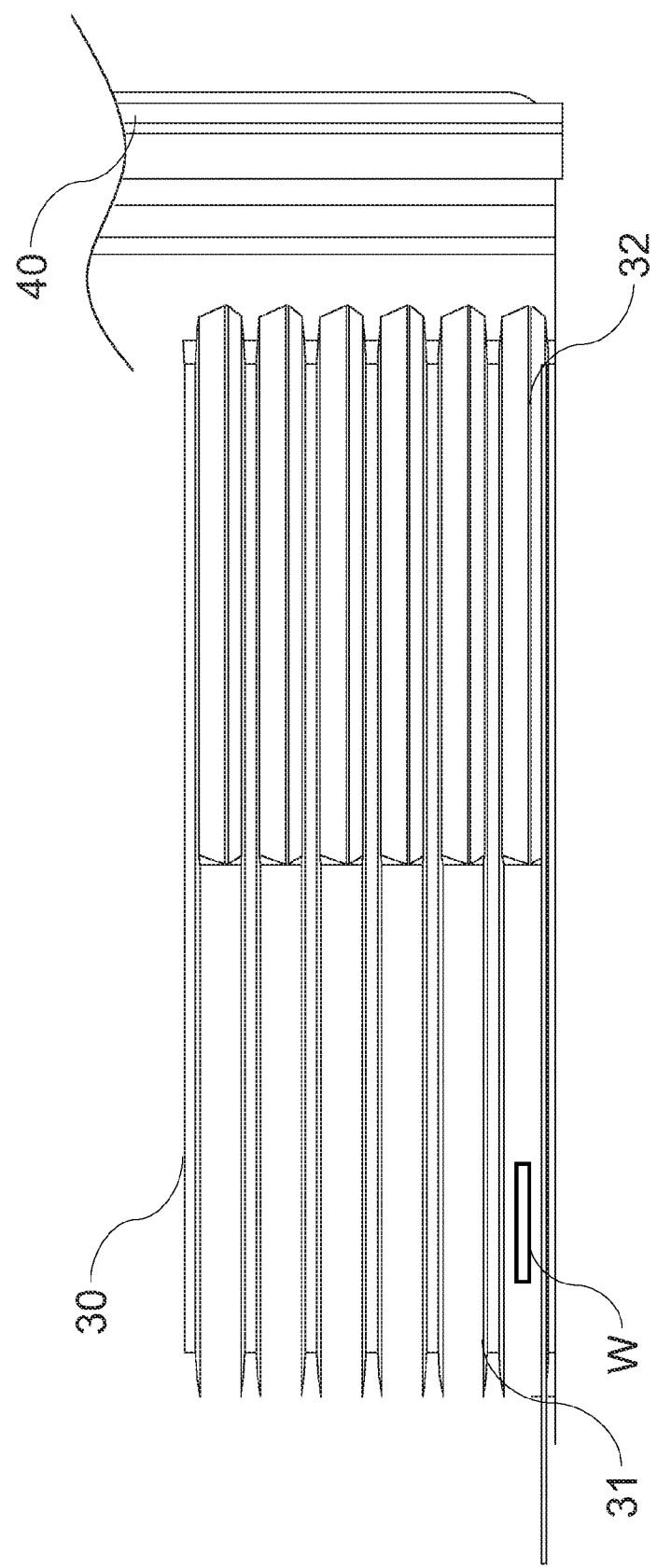
FIG. 8A to FIG. 8B are views of wafer container of the present invention when the door and the container body are disjoined and joined.
Figure 9A:
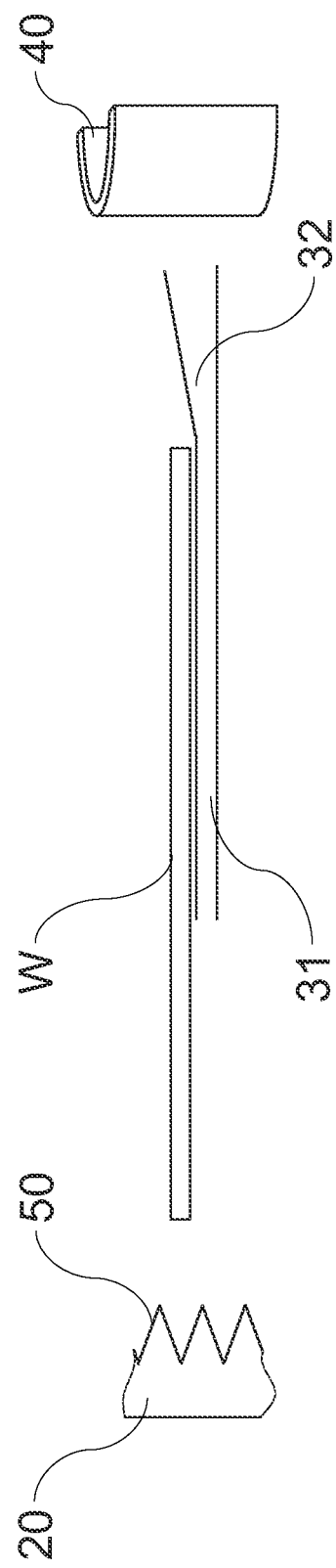
FIG. 9A to FIG. 9C are views of relative positions of the wafers and the door and the container body of the wafer container of the present invention.

Then, referring to FIG. 8A, which is a view of the position of wafers when the door 20 and the container body 10 of the present invention are disjoined. As shown in FIG. 8A, when wafers W are stored in the container body 10, the slot portions 30 can horizontally sustain and carry a plurality of wafers W, and each of the slot portions 30 has a horizontal carrying portion 31 that can be in contact with each of the wafers W. Apparently, when the door 20 and the container body 10 are disjoined, the wafers W and the horizontal carrying portions 31 are in contact with each other; meantime, a view of the relative positions of the door 20, the container body 10, and the wafers W is as shown in FIG. 9A.

Figure 8B:
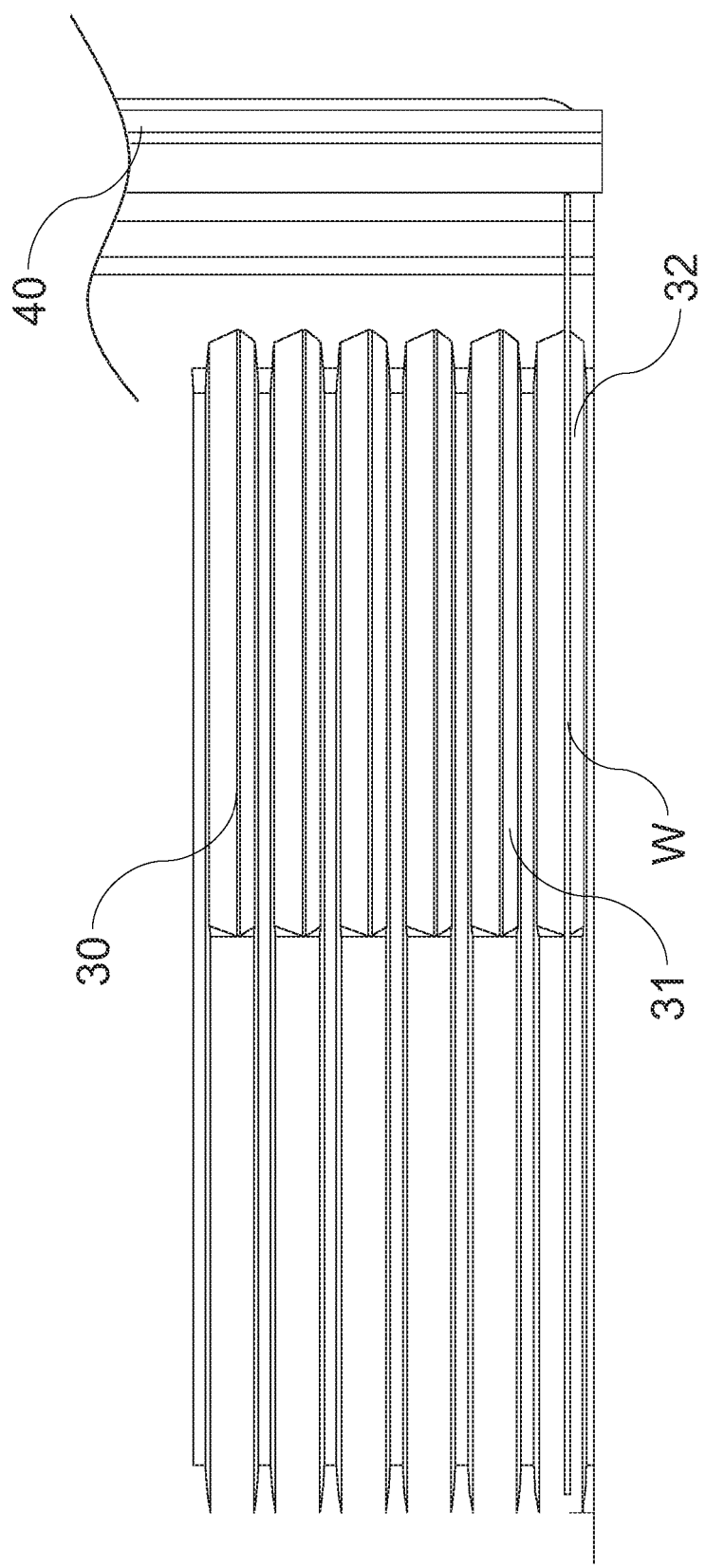
Figure 9B:
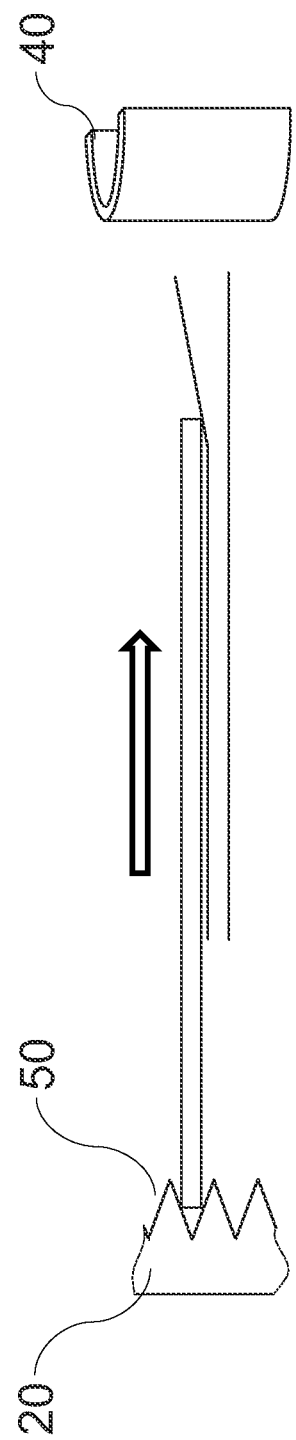
Figure 9C:
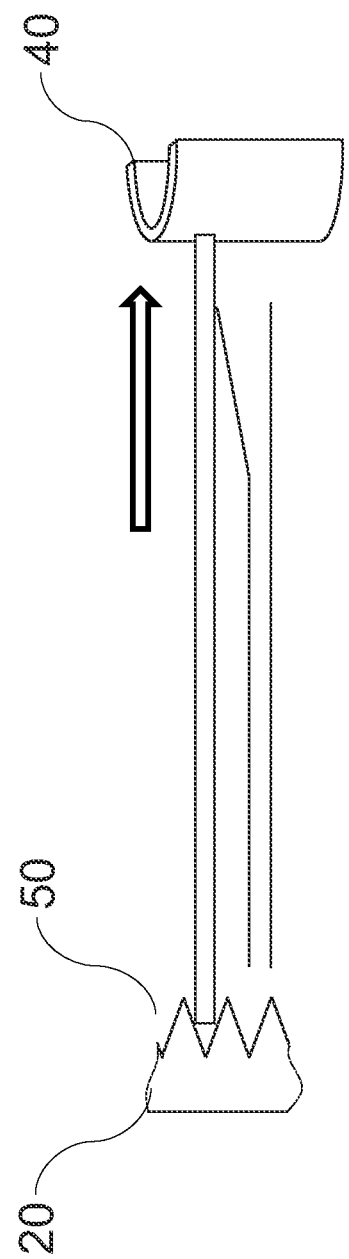

Then, referring to FIG. 8B, which is a view of the position of wafers when the door 20 and the container body 10 of the present invention are joined. When the door 20 starts to close the opening 12 of the container body 10, the bevel structures 57 (as shown in FIG. 7B) of the restraint modules 50 on the door 20 first contact the wafers W and push the wafers W to the interior of the container body 10; meantime, wafers W also move to the recess portion 59 (as shown in FIG. 7B) along with the bevel structures 57. Then, as wafers W continue to move, they will gradually move from horizontal carrying portions 31 to slant portions 32. During the process, with the support of bevel structures 57 on the door 20 and the slant portions 32 on the slot portions 30, the wafers W are gradually raised upward when they are pushed toward the interior of the container body 10; meantime, a view of the relative positions of the door 20, the container body 10, and the wafers W is as shown in FIG. 9B. When the door 20 completely closes the container body 10, edges of the wafers W near the door 20 are in contact with the recess portion 59 in the bevel structures 57 of restraint modules 50, and edges of some of the wafers W are in contact with the slant portions 32 on the slot portions 30; edges of the wafers W near the inner wall 14 of the container body 10 are in contact with the convex portions 42 of the elasticity module 40 and extend into the space made by the inwardly recessed portion 44 for the wafers W to be suspendingly placed in the container body 10; meantime, a view of the relative positions of the door 20, the container body 10, and the wafers W is as shown in FIG. 9C.

Figure 11A:
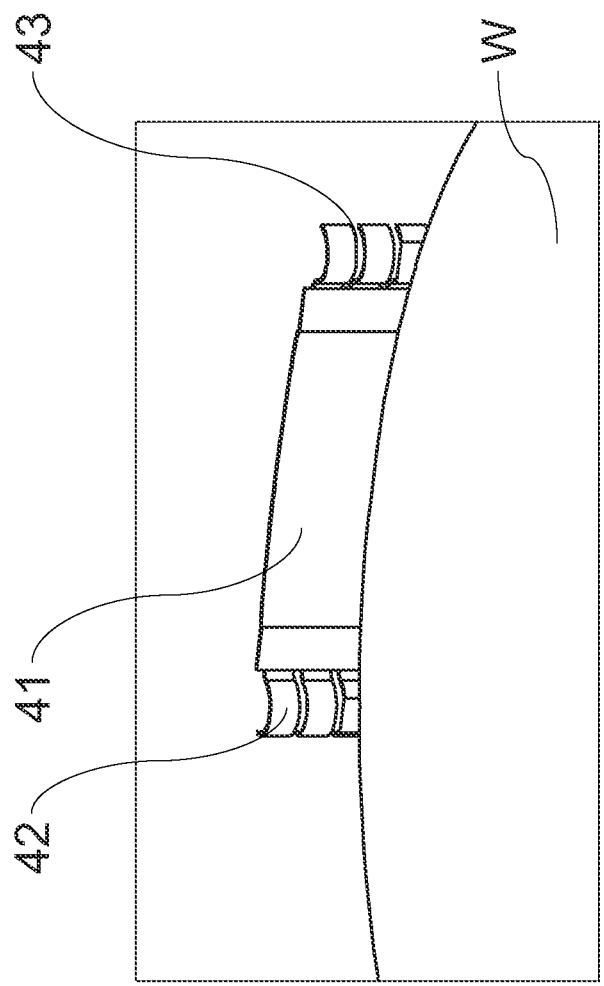
FIG. 11A to FIG. 11B are views of the wafers and the elasticity module of the present invention in contact with each other.
Figure 11B:
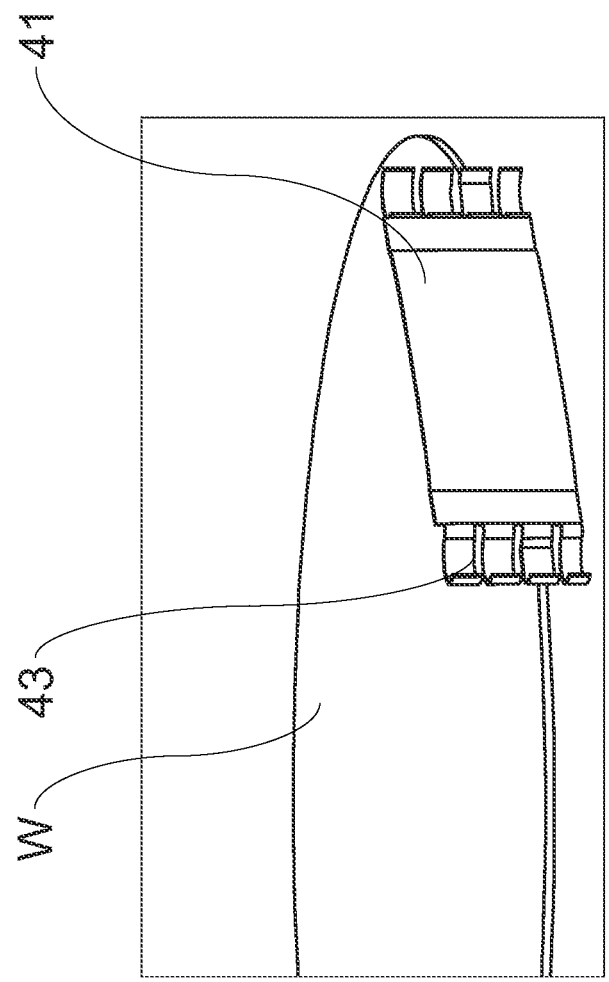

Referring then to FIG. 10, which is a top perspective view of the wafer container of the present invention when the door 20 closes the container body 10. As shown in FIG. 10, in the present invention, an elasticity module 40 is disposed on the inner wall 14 of the rear end of the interior of container body 10 opposite to the opening 12. Thus when the door 20 and the container body 10 are joined, the wafers W are suspendingly placed in the container body 10, and one edge of wafers W will be placed in the space made by the inwardly recessed portion 44 of the elasticity module 40 and another edge of wafers W will be in contact with a pair of convex portions 42 of the elasticity module 40, as shown in FIG. 11A and FIG. 11B. Meantime, a compressed deformation of the rectangular body 41 and the convex portions 42 of the elasticity module 40 is generated. Thus, with the design of elasticity module 40 that cooperates with the restraint module 50 on the door 20 for sustaining wafers W and providing an elastic buffer, movement of wafers W during the transferring process that may lead to damage can be prevented.

Referring then to FIG. 8A, when the door 20 and the opening 12 of the container body 10 are disjoined, a counterforce generated by the compressed deformation of the elasticity module 40 will be provided to wafers W to push wafers W toward the opening 12 of the container body 10 and let the wafers W slide downward along the slant portions 32 and return to the original position so that the possibility of wafer slipping can be avoided. Wherein, if the elasticity module 40 is the same as that of the second or the third embodiment of the present invention, i.e. with its convex portions 42 having a plurality of notches 43 vertically arranged at intervals, each of the wafers W can then be evenly provided with counterforce of the same strength so that the displacement measure of each wafer W pushed toward the opening 12 of the container body 10 will be the same. According to the operation described above, the displacement measure of wafers W can be controlled as between 1 mm and 3 mm to comply with SEMI standards.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A wafer container, comprising a container body, a plurality of slot portions being disposed on two opposite sidewalls of the interior of said container body for sustaining a plurality of wafers, each of said slot portions having a horizontal carrying portion, an opening being formed on one side of said container body for exporting and importing said plurality of wafers, and a door, said door having an outer surface and an inner surface, said door being joined with said opening of said container body via said inner surface for protecting said plurality of wafers in the interior of said container body, wherein the characteristic of said wafer container is in that:

an elasticity module is disposed on inner wall of rear end of said container body opposite to said opening, said elasticity module having a body, two opposite sides of said body bending toward the interior of said container body to form a convex portion respectively, when the wafers contact the convex portions of the elasticity module, said body make a space for the wafers, when the door closes the container body, the convex portions are pushed by the wafer to be deformed, when the door and the container body are disjoined, each of the wafers is evenly provided with acting force that originates from the force of the convex portions returning to the original shape and is pushed toward the opening of the container body.

2. The wafer container according to claim 1, wherein said body of said elasticity module is in rectangular shape.

3. The wafer container according to claim 1, wherein said body further comprises an inwardly recessed portion.

4. The wafer container according to claim 1, wherein a fastening piece is formed on rear end of each of said slot portions.

5. The wafer container according to claim 4, wherein an upwardly extending slant portion is formed on one end of said horizontal carrying portion of each of said slot portions near said fastening piece.

6. The wafer container according to claim 5, wherein said slot portions and said slant portions are integratedly formed by injection molding.

7. The wafer container according to claim 1, wherein material of said elasticity module is polymer plastic material.

8. The wafer container according to claim 1, wherein a recess is disposed on said inner surface of said door and said recess is located between two raised platforms, a restraint module being respectively disposed on edges of said two raised platforms near said recess.

9. A wafer container, comprising a container body, a plurality of slot portions being disposed on two opposite sidewalls of the interior of said container body for sustaining a plurality of wafers, each of said slot portions having a horizontal carrying portion, an opening being formed on one side of said container body for exporting and importing said plurality of wafers, and a door, said door having an outer surface and an inner surface, said door being joined with said opening of said container body via said inner surface for protecting said plurality of wafers in the interior of said container body, wherein the characteristic of said wafer container is in that:

an elasticity module is disposed on inner wall of rear end of said container body opposite to said opening, said elasticity module having a body, two opposite sides of said body bending toward interior of said container body to form a convex portion respectively, said convex portions having a plurality of notches vertically arranged at intervals, when the wafers contact the convex portions of the elasticity module, said body make a space for the wafers, when the door closes the container body, the convex portions are pushed by the wafer to be deformed, when the door and the container body are disjoined, each of the wafers is evenly provided with acting force that originates from the force of the convex portions returning to the original shape and is pushed toward the opening of the container body.

10. The wafer container according to claim 9, wherein said body of said elasticity module is in rectangular shape.

11. The wafer container according to claim 9, wherein said body further comprises an inwardly recessed portion.

12. The wafer container according to claim 9, wherein a fastening piece is formed on rear end of each of said slot portions.

13. The wafer container according to claim 12, wherein an upwardly extending slant portion is formed on one end of said horizontal carrying portion of each of said slot portions near said fastening piece.

14. The wafer container according to claim 13, wherein said slot portions and said slant portions are integratedly formed by injection molding.

15. The wafer container according to claim 9, wherein material of said elasticity module is polymer plastic material.

16. The wafer container according to claim 9, wherein a recess is disposed on said inner surface of said door and said recess is located between two raised platforms, a restraint module being respectively disposed on edges of said two raised platforms near said recess.

* * * * *